(12) United States Patent
Tseng et al.

(10) Patent No.: US 8,796,812 B2
(45) Date of Patent: Aug. 5, 2014

(54) SELF-ALIGNED TRENCH OVER FIN

(75) Inventors: Chiahsun Tseng, Wynantskill, NY (US); Chun-chen Yeh, Clifton Park, NY (US); Yunpeng Yin, Niskayuna, NY (US); Lei L. Zhuang, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/561,142

(22) Filed: Jul. 30, 2012

(65) Prior Publication Data

US 2014/0027878 A1  Jan. 30, 2014

(51) Int. Cl.
  *H01L 29/00* (2006.01)
(52) U.S. Cl.
  USPC ............. 257/506; 257/E21.214; 257/E29.002
(58) Field of Classification Search
  USPC ........................... 257/506, E21.214, E29.002
  See application file for complete search history.

(56) References Cited

U.S. PATENT DOCUMENTS

| | | | |
|---|---|---|---|
| 5,824,592 A | * | 10/1998 | Tseng ........................... 438/396 |
| 6,624,018 B1 | | 9/2003 | Yu et al. |
| 6,947,275 B1 | | 9/2005 | Anderson et al. |
| 7,488,650 B2 | | 2/2009 | Schulz |
| 7,776,684 B2 | | 8/2010 | Doyle et al. |
| 7,923,337 B2 | | 4/2011 | Chang et al. |
| 2006/0189043 A1 | | 8/2006 | Schulz |
| 2010/0155908 A1 | | 6/2010 | Shiu |
| 2011/0269294 A1 | | 11/2011 | Koh et al. |

* cited by examiner

*Primary Examiner* — David S Blum
(74) *Attorney, Agent, or Firm* — Scully, Scott, Murphy & Presser, P.C.; Yuanmin Cal

(57) ABSTRACT

A stack of a first hard mask portion and a second hard mask portion is formed over a semiconductor material layer by anisotropically etching a stack, from bottom to top, of a first hard mask layer and a second hard mask layer. The first hard mask portion is laterally recessed by an isotropic etch. A dielectric material layer is conformally deposited and planarized. The dielectric material layer is etched employing an anisotropic etch that is selective to the first hard mask portion to form a dielectric material portion that laterally surrounds the first hard mask portion. After removal of the second and first hard mask portions, the semiconductor material layer is etched employing the dielectric material portion as an etch mask. Optionally, portions of the semiconductor material layer underneath the first and second hard mask portions can be undercut at a periphery.

20 Claims, 18 Drawing Sheets

SELF-ALIGNED TRENCH OVER FIN

BACKGROUND

The present disclosure relates to a semiconductor structure, and more particularly to a semiconductor structure including a trench that is self-aligned to a semiconductor fin, and a method of manufacturing the same.

Semiconductor fins provide a greater surface area than planar semiconductor portions. The increased surface area provided by semiconductor fins can be advantageously employed for various applications, which include field effect transistors having a greater channel area and capacitors. Lateral dimensions of a semiconductor fin are limited by minimum dimensions that can be printed by lithographic tools. Methods of increasing surface areas of a semiconductor fin without reducing lithographically printed lateral dimensions are thus desired.

SUMMARY

A stack of a first hard mask portion and a second hard mask portion is formed over a semiconductor material layer by anisotropically etching a stack, from bottom to top, of a first hard mask layer and a second hard mask layer. The first hard mask portion is laterally recessed by an isotropic etch. A dielectric material layer is conformally deposited and planarized. The dielectric material layer is etched employing an anisotropic etch that is selective to the first hard mask portion to form a dielectric material portion that laterally surrounds the first hard mask portion. After removal of the second and first hard mask portions, the semiconductor material layer is etched employing the dielectric material portion as an etch mask. Optionally, portions of the semiconductor material layer underneath the first and second hard mask portions can be undercut at a periphery to provide a semiconductor fin having a narrower base than a lateral extent at a topmost portion thereof.

According to an aspect of the present disclosure, a semiconductor structure is provided, which includes a semiconductor fin located on a dielectric layer. The semiconductor fin includes a lower portion and an upper portion. The upper portion includes a first upper portion integrally adjoined to a first peripheral portion of the lower portion and a second upper portion integrally adjoined to a second peripheral portion of the lower portion. A cavity embedded in the semiconductor fin vertically extends from top surfaces of the first and second upper portions to a top surface of the lower portion, and laterally extends from an inner sidewall of the first upper portion to an inner sidewall of the second upper portion.

According to another aspect of the present disclosure, a method of forming a semiconductor structure is provided. A vertical stack, from bottom to top, of a first hard mask portion laterally surrounded by a dielectric material portion and a second hard mask portion is formed over a semiconductor material layer. Outer sidewalls of the dielectric material portion are vertically coincident with sidewalls of the second hard mask portion. The second hard mask portion and the first hard mask portion are removed selective to the dielectric material portion. The semiconductor material layer is patterned into a semiconductor fin by anisotropically etching the semiconductor material layer employing the dielectric material portion as an etch mask.

DETAILED DESCRIPTION

Figure 1A:
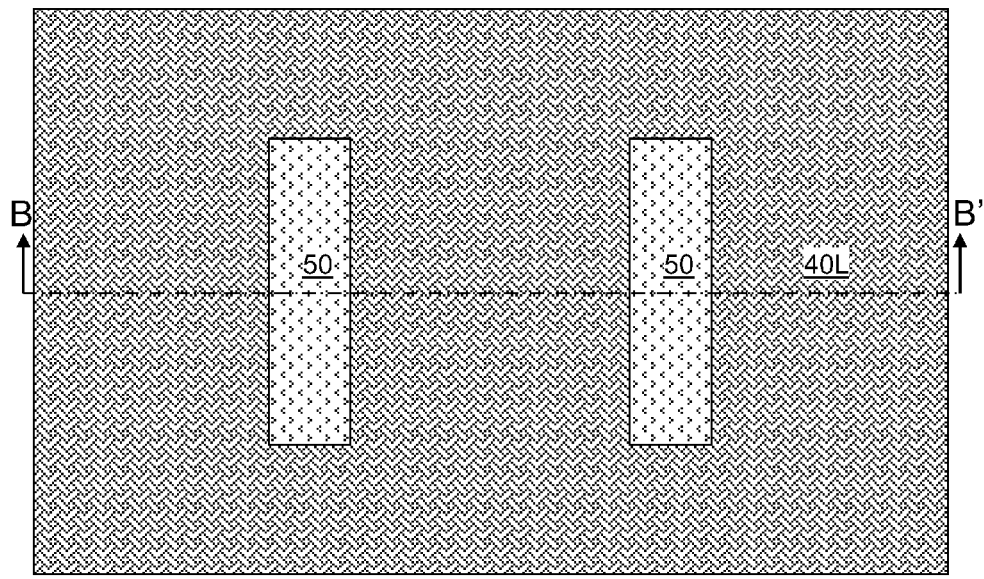
FIG. 1A is a top-down view of a first exemplary semiconductor structure after formation of a first hard mask layer, a second hard mask layer, and disposable mandrel structures according to an embodiment of the present disclosure.

As stated above, the present disclosure relates to a semiconductor structure including a trench that is self-aligned to a semiconductor fin, and a method of manufacturing the same.

Aspects of the present disclosure are now described in detail with accompanying figures. It is noted that like reference numerals refer to like elements across different embodiments. The drawings are not necessarily drawn to scale.

Figure 1B:
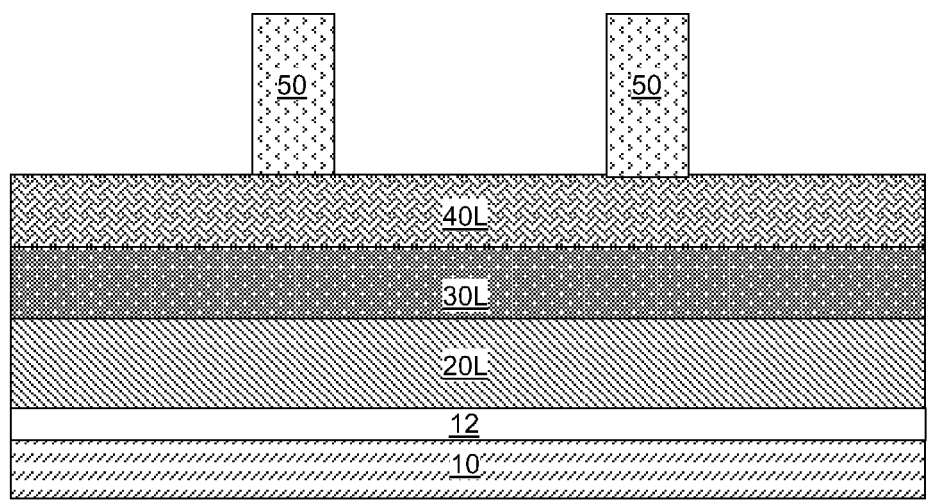
FIG. 1B is a vertical cross-sectional view of the first exemplary semiconductor structure along the vertical plane B-B' of FIG. 1A.

Referring to FIGS. 1A and 1B, a first exemplary semiconductor structure according to an embodiment of the present disclosure includes a stack, from bottom to top, of a handle substrate 10, a buried insulator layer 12, a semiconductor material layer 20L, a first hard mask layer 30L, and a second hard mask layer 40L. In one embodiment, the handle substrate 10, the buried insulator layer 12, and the semiconductor material layer 20L can be provided as a semiconductor-on-insulator (SOI) substrate.

The handle substrate 10 can include a semiconductor material, a conductive material, and/or a dielectric material. The handle substrate 10 can provide mechanical support to the buried insulator layer and the semiconductor material layer 20L. The thickness of the handle substrate 10 can be from 30 microns to 2 mm, although lesser and greater thicknesses can also be employed.

The buried insulator layer 12 can include a dielectric material such as silicon oxide, silicon nitride, silicon oxynitride, or a combination thereof. The thickness of the buried insulator layer 12 can be from 50 nm to 5 microns, although lesser and greater thicknesses can also be employed. The buried insulator layer 12 underlies the semiconductor material layer 20L, and is also referred to as an "underlying layer" in the present disclosure.

The semiconductor material layer 20L includes a semiconductor material, which can be an elemental semiconductor material or a compound semiconductor material. For example, the semiconductor material can be silicon, germanium, a silicon-germanium alloy, or a silicon-carbon alloy. The semiconductor material may, or may not, be doped with p-type dopants and/or n-type dopants. The semiconductor material can be a single crystalline semiconductor material, a polycrystalline semiconductor material, or an amorphous semiconductor material. In one embodiment, the semiconductor material can be silicon. In one embodiment, the semiconductor material can be single crystalline silicon. The thickness of the semiconductor material layer 20L can be from 10 nm to 500 nm, although lesser and greater thicknesses can also be employed.

A first hard mask layer 30L is deposited on the top surface of the semiconductor material layer 20L. The first hard mask layer 30L includes a first dielectric material, which can be, for example, silicon nitride or silicon oxide. The first hard mask layer 30L can be deposited, for example, by chemical vapor deposition. The first hard mask layer 30L can be deposited as a blanket layer having a same thickness throughout. The thickness of the first hard mask layer 30L can be from 10 nm to 300 nm, although lesser and greater thicknesses can also be employed.

A second hard mask layer 40L is deposited on the top surface of the first hard mask layer 30L. The second hard mask layer 40L includes a second dielectric material, which can be, for example, a dielectric metal oxide such as hafnium oxide, zirconium oxide, tantalum oxide, titanium oxide, lanthanum oxide, or alloys or combinations thereof. The second hard mask layer 40L can be deposited, for example, by chemical vapor deposition or atomic layer deposition. The second hard mask layer 40L can be deposited as a blanket layer having a same thickness throughout. The thickness of the second hard mask layer 40L can be from 10 nm to 300 nm, although lesser and greater thicknesses can also be employed.

Disposable mandrel structures 50 are formed on the top surface of the second hard mask layer 40L. In one embodiment, the disposable mandrel structures 50 can be formed by depositing a photoresist layer and by lithographically exposing and developing the photoresist layer. In one embodiment, the disposable mandrel structures 50 can have a horizontal cross-sectional shape of a rectangle.

Figure 2A:
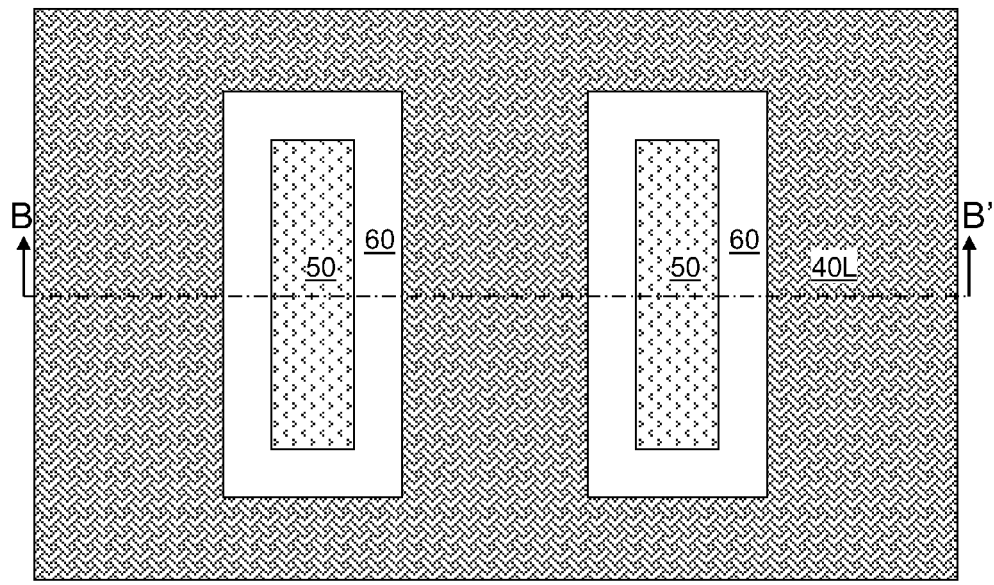
FIG. 2A is a top-down view of the first exemplary semiconductor structure after formation of spacer structures according to an embodiment of the present disclosure.
Figure 2B:
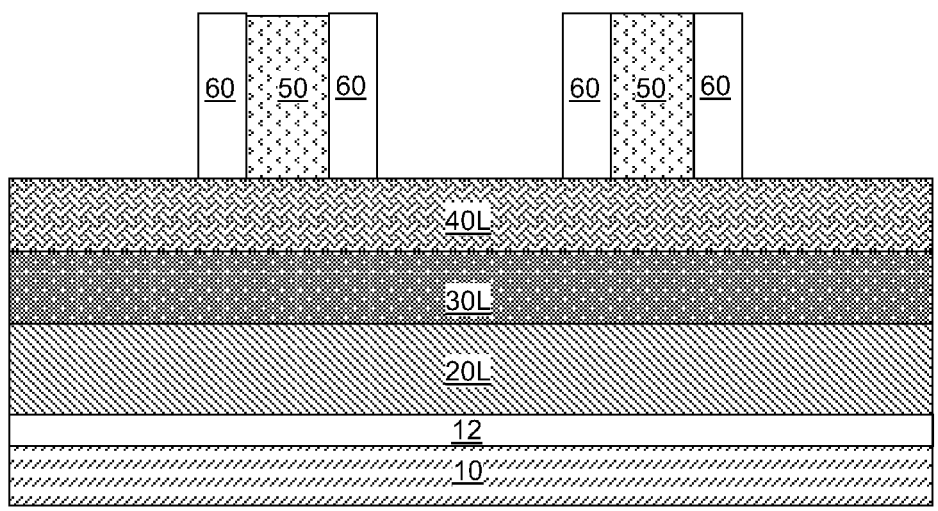
FIG. 2B is a vertical cross-sectional view of the first exemplary semiconductor structure along the vertical plane B-B' of FIG. 2A.

Referring to FIGS. 2A and 2B, spacer structures 60 are formed on the sidewalls of the disposable mandrel structures 50 by depositing a conformal material layer and by removing horizontal portions of the conformal material layer by an anisotropic etch. In one embodiment, the conformal material layer can be a silicon oxide layer that is deposited by plasma enhanced chemical vapor deposition (PECVD). In one embodiment, the silicon oxide layer can be deposited at a temperature that does not cause volatilization of the disposable mandrel structures 50. For example, the temperature for deposition of the silicon oxide layer can be less than 200° C. The width of the spacer structures 60, as measured at the base of the spacer structures 60 between an interface with a disposable mandrel structure and the most proximate outer sidewall of the spacer structure 60, can be from 3 nm to 150 nm, although lesser and greater widths can also be employed. In one embodiment, the spacer structures 60 can be ring-shaped. In one embodiment, the spacer structures 60 can have horizontal cross-sectional areas in the shape of rectangular rings having a rectangular outer periphery and a rectangular inner periphery.

Figure 3A:
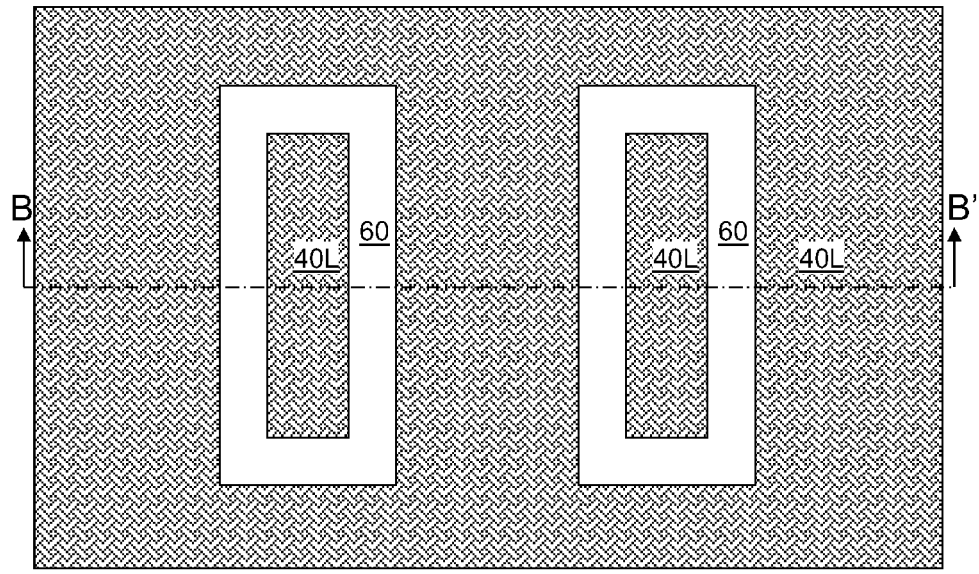
FIG. 3A is a top-down view of the first exemplary semiconductor structure after removal of the disposable mandrel structures according to an embodiment of the present disclosure.
Figure 3B:
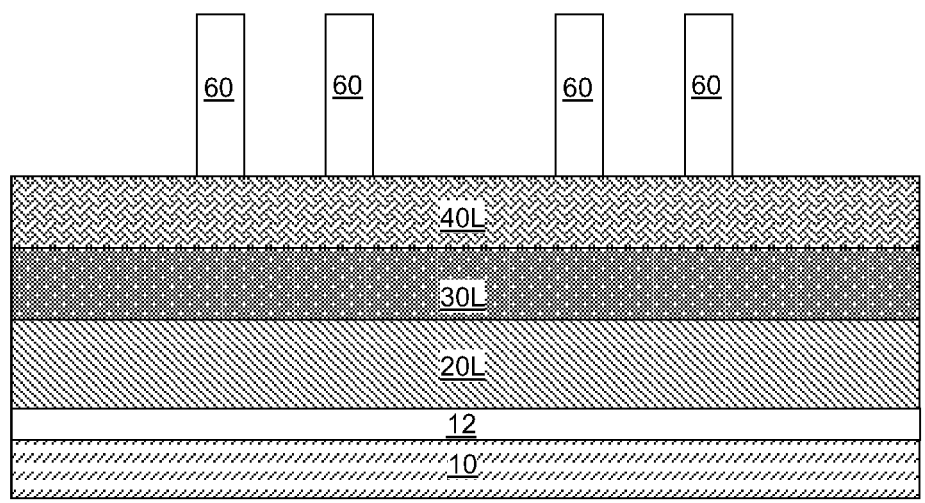
FIG. 3B is a vertical cross-sectional view of the first exemplary semiconductor structure along the vertical plane B-B' of FIG. 3A.

Referring to FIGS. 3A and 3B, the disposable mandrel structures 50 are removed selective to the spacer structures 60 and the second hard mask layer 40L. If the disposable mandrel structures 50 include a photoresist material, the disposable mandrel structures 50 can be removed by ashing, i.e., by burning the photoresist material in an oxygen-containing environment. A top surface of the second hard mask layer 40L is physically exposed underneath each cavity formed by removal of the disposable mandrel structures 50.

Figure 4A:
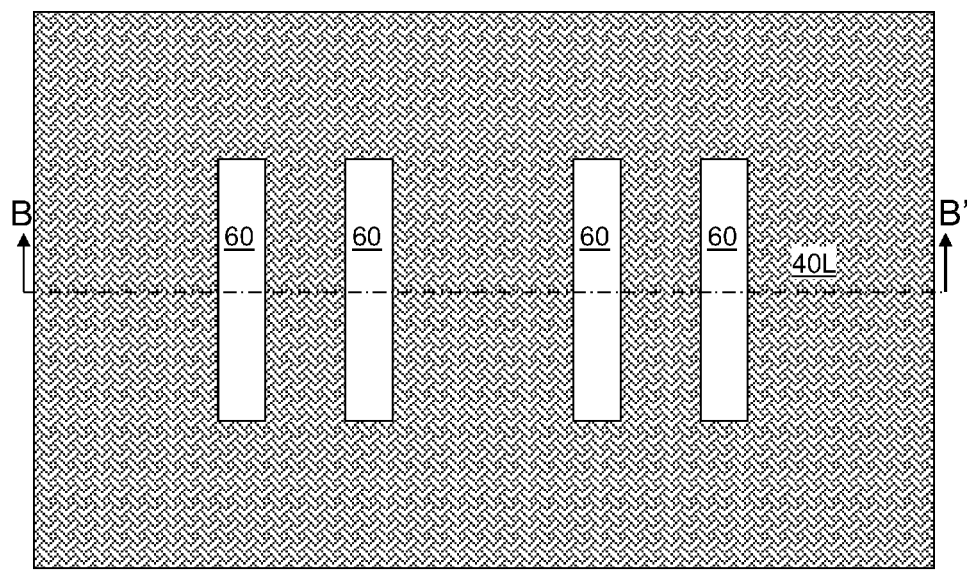
FIG. 4A is a top-down view of the first exemplary semiconductor structure after patterning of the spacer structures according to an embodiment of the present disclosure.
Figure 4B:
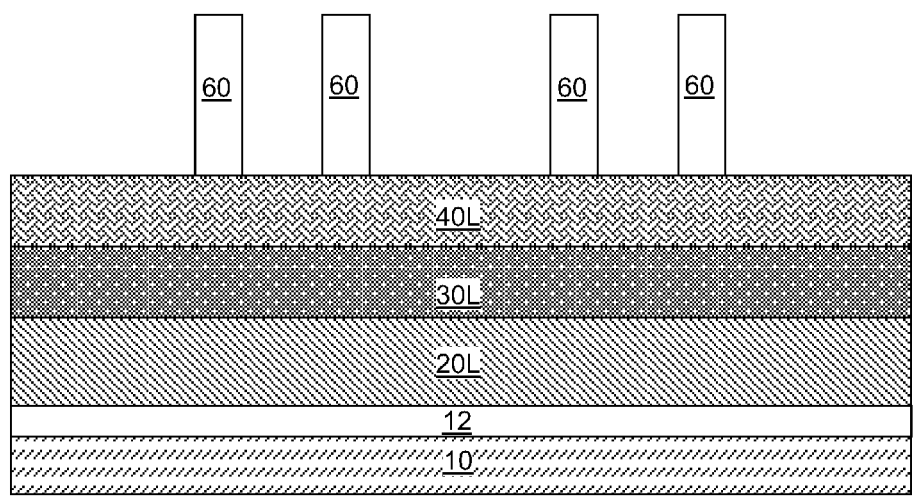
FIG. 4B is a vertical cross-sectional view of the first exemplary semiconductor structure along the vertical plane B-B' of FIG. 4A.

Referring to FIGS. 4A and 4B, end portions of the spacer structures 60 can be optionally removed, for example, by applying a photoresist layer (not shown) over the spacer structures 60, by patterning the photoresist layer to straddle the spacer structures 60 while physically exposing end portions of the spacer structures 60, and by removing the physically exposed end portions of the spacer structures 60 by an etch such as an anisotropic etch employing the patterned photoresist layer as an etch mask. Each spacer structure 60 can be divided into two portions by the etch. The patterned photoresist layer can be removed selective to the spacer structures 60 and the second hard mask layer, for example, by ashing. In one embodiment, the spacer structures 60 can have rectangular cross-sectional shapes.

Figure 5A:
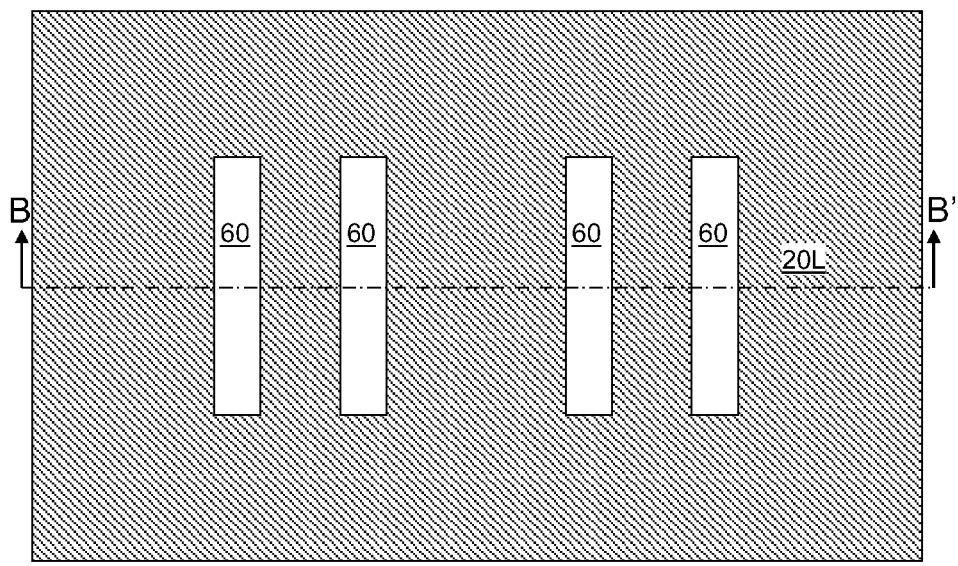
FIG. 5A is a top-down view of the first exemplary semiconductor structure after patterning of stacks of a first hard mask portion and a second hard mask portion according to an embodiment of the present disclosure.
Figure 5B:
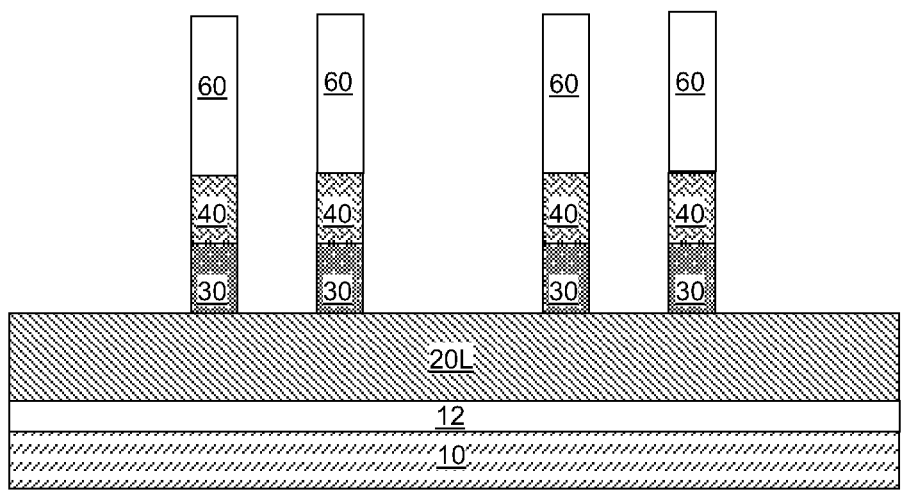
FIG. 5B is a vertical cross-sectional view of the first exemplary semiconductor structure along the vertical plane B-B' of FIG. 5A.

Referring to FIGS. 5A and 5B, the pattern in the spacer structures 60 can be transferred through the second hard mask layer 40L and the first hard mask layer 30L, for example, by an anisotropic etch. Each remaining portion of the second hard mask layer 40L is herein referred to as a second hard mask portion 40, and each remaining portion of the first hard mask layer 30L is herein referred to as a first hard mask portion 30. Each second hard mask portion 40 can have the same horizontal cross-sectional shape as the overlying spacer structure 60. Each first hard mask portion 40 can have the same horizontal cross-sectional shape as the overlying spacer structure 60.

In one embodiment, the etch chemistry employed to etch the first hard mask layer 30 can be selective to the material of the semiconductor material layer 20L. Material stacks having vertically coincident sidewalls are formed over the semiconductor material layer. As used herein, multiple surfaces are "vertically coincident" if the multiple surfaces are within a same vertical plane. Each material stack includes, from bottom to top, a first hard mask portion 30, a second hard mask portion 40, and a spacer structure 60. Within each material stack, the sidewalls of the first hard mask portion 30 can be vertically coincident with the sidewalls of the second hard mask portion 40 and the sidewalls of the spacer structure 60.

Figure 6A:
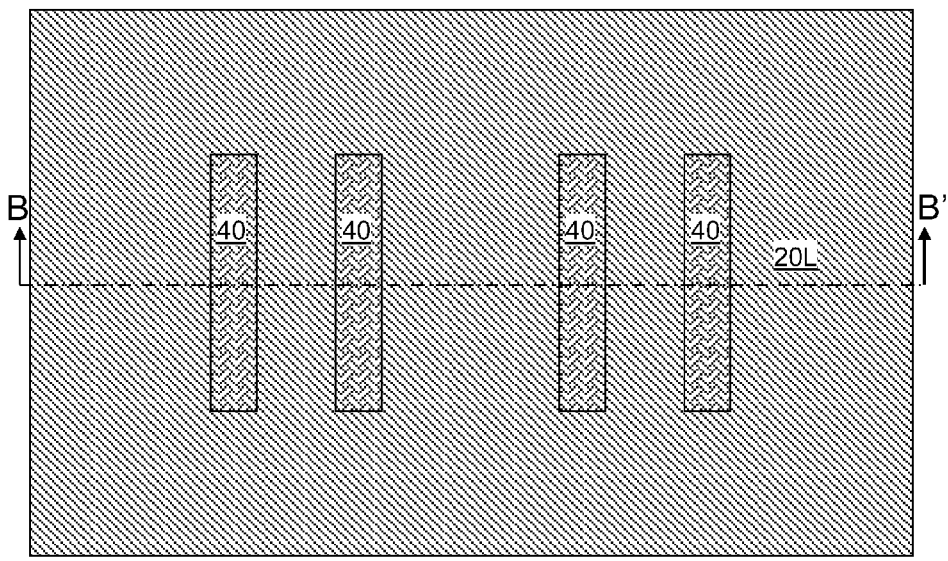
FIG. 6A is a top-down view of the first exemplary semiconductor structure after removal of the spacer structures according to an embodiment of the present disclosure.
Figure 6B:
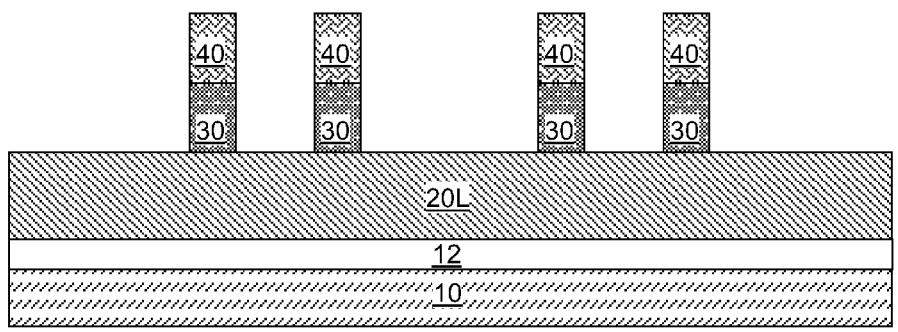
FIG. 6B is a vertical cross-sectional view of the first exemplary semiconductor structure along the vertical plane B-B' of FIG. 6A.

Referring to FIGS. 6A and 6B, the spacer structures 60 can be removed selective to the first hard mask portions 30 and the second hard mask portions 40. For example, if the spacer structures 60 include silicon oxide, the spacer structures 60 can be removed by a wet etch or a vapor phase etch employing a hydrofluoric acid-based etch chemistry.

Figure 7A:
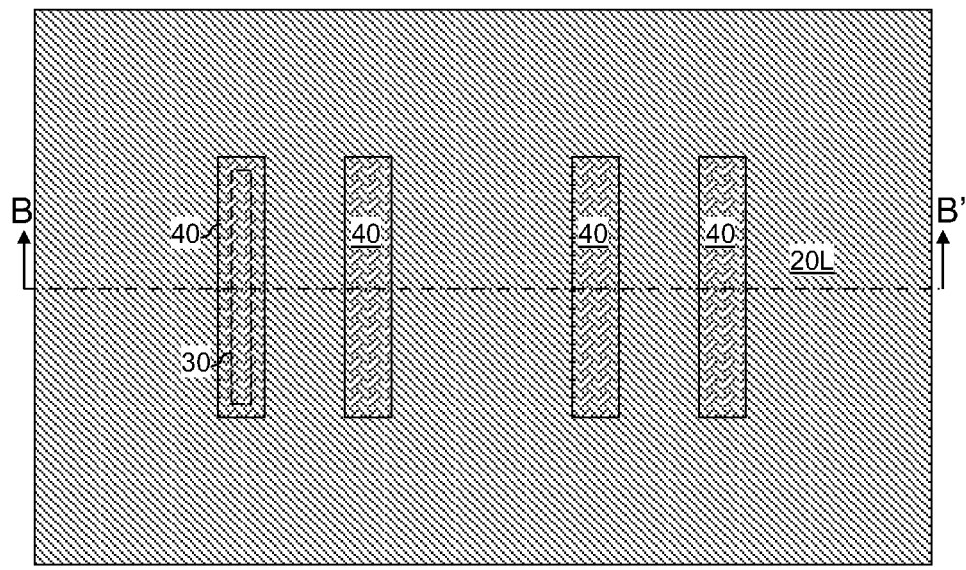
FIG. 7A is a top-down view of the first exemplary semiconductor structure after lateral recessing of the first hard mask portions according to an embodiment of the present disclosure.
Figure 7B:
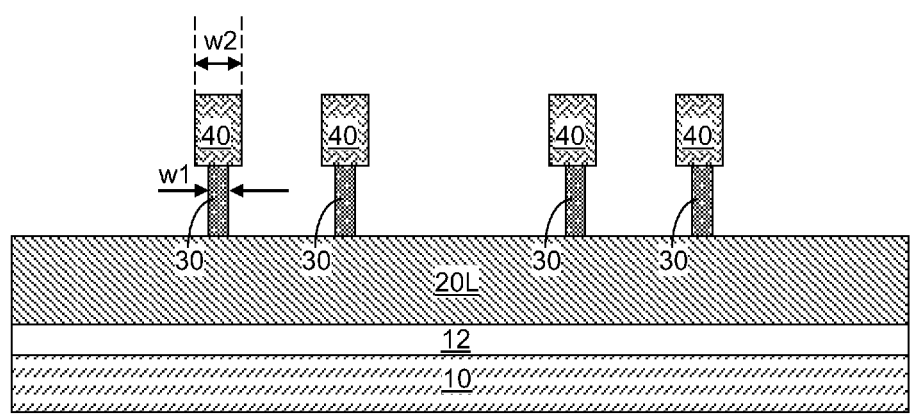
FIG. 7B is a vertical cross-sectional view of the first exemplary semiconductor structure along the vertical plane B-B' of FIG. 7A.

Referring to FIGS. 7A and 7B, the sidewalls of the first hard mask portions 30 are laterally recessed relative to the sidewalls of the second hard mask portions 40. The lateral recessing of the sidewalls of the first hard mask portions 30 can be performed by an isotropic etch, which can be a wet etch or a vapor phase etch. For example, if the first hard mask portion 30 includes silicon nitride, a wet etch employing hot phosphoric acid can be employed to laterally recess the sidewalls of the first hard mask portions 30.

The lateral recessing of the sidewalls of the first hard mask portions 30 causes each remaining portion of the first hard mask portion 30 to have a lesser width than the width of an overlying second hard mask portion 40. For example, a first hard mask portion 30 can have a first width w1, and an overlying second hard mask portion 40 can have a second width w2, such that the second width w2 is greater than the first width w1. Further, the lateral offset of each sidewall of the first hard mask portion 30 relative to a sidewall of the overlying second hard mask portion can be the same throughout the periphery of the first hard mask portion 30, and can be given by: $(w2-w1)/2$.

Figure 8A:
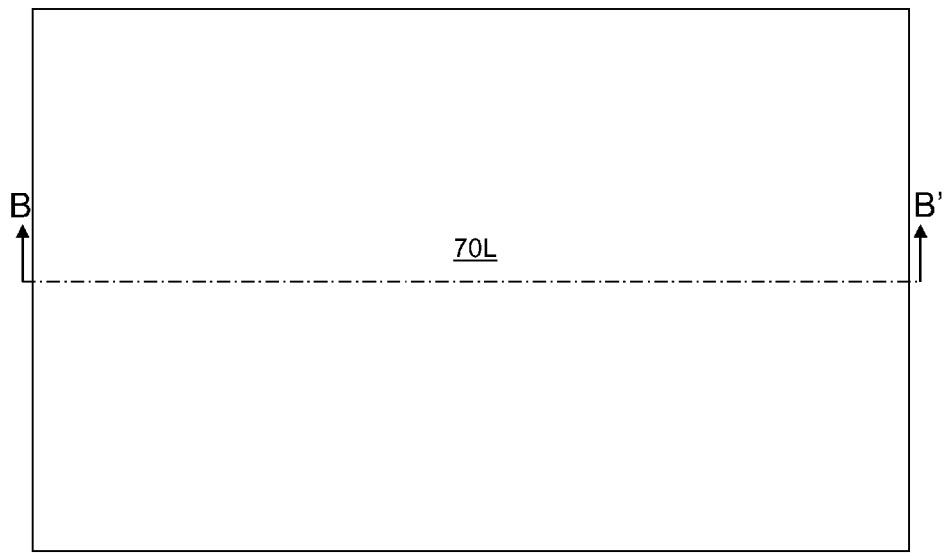
FIG. 8A is a top-down view of the first exemplary semiconductor structure after formation of a dielectric material layer according to an embodiment of the present disclosure.
Figure 8B:
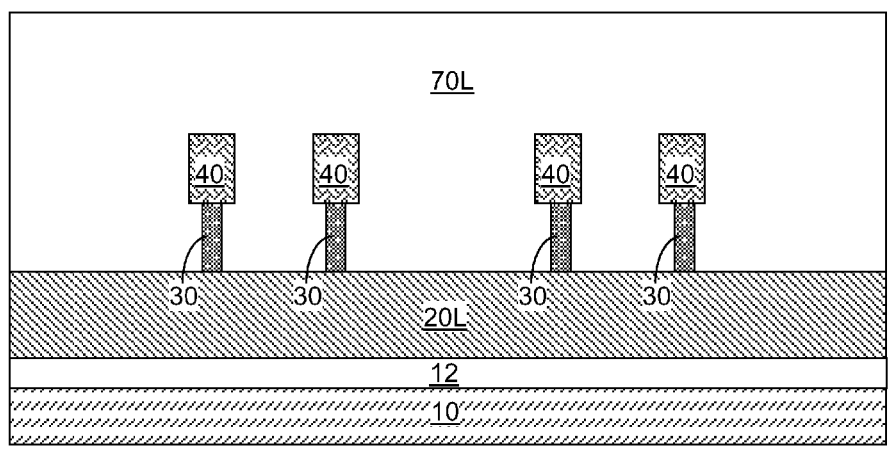
FIG. 8B is a vertical cross-sectional view of the first exemplary semiconductor structure along the vertical plane B-B' of FIG. 8A.

Referring to FIGS. 8A and 8B, a dielectric material layer 70L is deposited on the sidewalls of the first and second hard mask portions 30, the top surface of the hard mask portions 40, and physically exposed surfaces of the semiconductor material layer 20L. The dielectric material layer 70L includes a dielectric material that is different from the materials of the first and second hard mask portions (30, 40). If the first hard mask portions 30 include silicon nitride and the second hard mask portions 40 include a dielectric metal oxide, the dielectric material layer 70L can include silicon oxide or organosilicate glass (OSG). The dielectric material layer 70L can be deposited by a conformal deposition method such as chemical vapor deposition or by a self-planarizing deposition method such as spin-coating. The volumes formed by lateral recessing of the sidewall surfaces of the first hard mask portions 30, which are located around sidewalls of the first hard mask portions 30 and underlies bottom surfaces of the second hard mask portions 40, are filled with the dielectric material layer 70L. Optionally, the top surface of the dielectric material layer 70L can be planarized, for example, by chemical mechanical planarization (CMP).

Figure 9A:
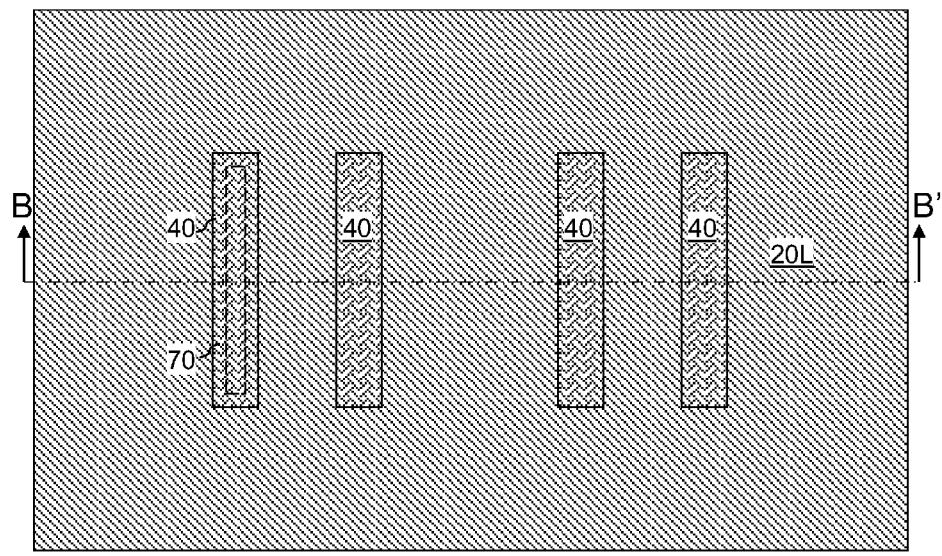
FIG. 9A is a top-down view of the first exemplary semiconductor structure after formation of dielectric material portions by anisotropically etching the dielectric material layer and after partial etching of a semiconductor material layer according to an embodiment of the present disclosure.
Figure 9B:
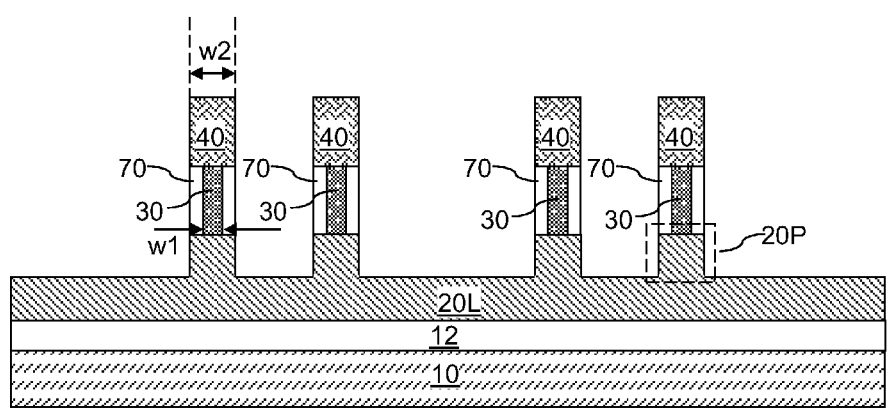
FIG. 9B is a vertical cross-sectional view of the first exemplary semiconductor structure along the vertical plane B-B' of FIG. 9A.

Referring to FIGS. 9A and 9B, the dielectric material layer 70L is anisotropically etched, for example, by a reactive ion etch. The chemistry of the anisotropic etch is selected such that the anisotropic etch is selective to the dielectric material of the second hard mask portions 40. For example, the anisotropic etch can be a reactive ion etch employing a plasma of $CF_4$, $CHF_3$, $CH_2F_2$, or combinations thereof. Thus, upon exposure of the top surfaces of the second hard mask portions 40, the dielectric material layer 70L can be etched employing the second hard mask portions 40 as an etch mask.

The portions of the dielectric material layer 70L located within the volumes formed by lateral recessing of the sidewall surfaces of the first hard mask portions 30 are protected by the overlying second hard mask portions 40 during the anisotropic etch, and thus, are not removed during the anisotropic etch. Thus, a ring-shaped remaining portion of the dielectric material layer 70L is present around each first hard mask portion 30. The ring-shaped remaining portions of the dielectric material layer 70L are herein referred to as dielectric material portions 70. In other words, each remaining portion of the dielectric material layer 70L laterally surrounding a second hard mask portion 30 is a dielectric material portion 70. Each dielectric material portion 70 can have a horizontal cross-sectional shape of a rectangular ring, which has a rectangular outer periphery that vertically coincides with the sidewalls of an overlying second hard mask portion 40 and a rectangular inner periphery. The dielectric material portions 70 can have a same width given by (w2−w1)/2 throughout the entirety of the periphery of the dielectric material portion 70.

Vertical stacks are formed by the anisotropic etch over the semiconductor material layer 20L. Each of the vertical stacks includes, from bottom to top, a first hard mask portion 30 laterally surrounded by a dielectric material portion 70 and a second hard mask portion 40. Outer sidewalls of the dielectric material portion 70 are vertically coincident with the sidewalls of the second hard mask portion 40.

In one embodiment, upon physical exposure of the top surface of the semiconductor material layer 20L, the etch chemistry of the anisotropic etch can be altered to etch the semiconductor material of the semiconductor material layer 20L. In this case, each vertical stack (30, 70, 40) can be employed as an etch mask for etching an upper portion of the semiconductor material layer 20L. The altered chemistry may, or may not, be selective to the material of the second hard mask portions 40. Physically exposed portions of the top surface of the semiconductor material layer 20L are vertically recessed so that semiconductor pedestal portions 20P are formed directly underneath each vertical stack including a composite structure of a first hard mask portion 30 and a dielectric material portion 70 and a second hard mask portion 40. In one embodiment, each semiconductor pedestal portion 20P can have the same horizontal cross-sectional area as the overlying second hard mask portion 40. The height of the second pedestal portions 20 can be in a range from 10% to 90% of the thickness of the semiconductor material layer 20L as provided, although lesser and greater percentages can also be employed.

Figure 10A:
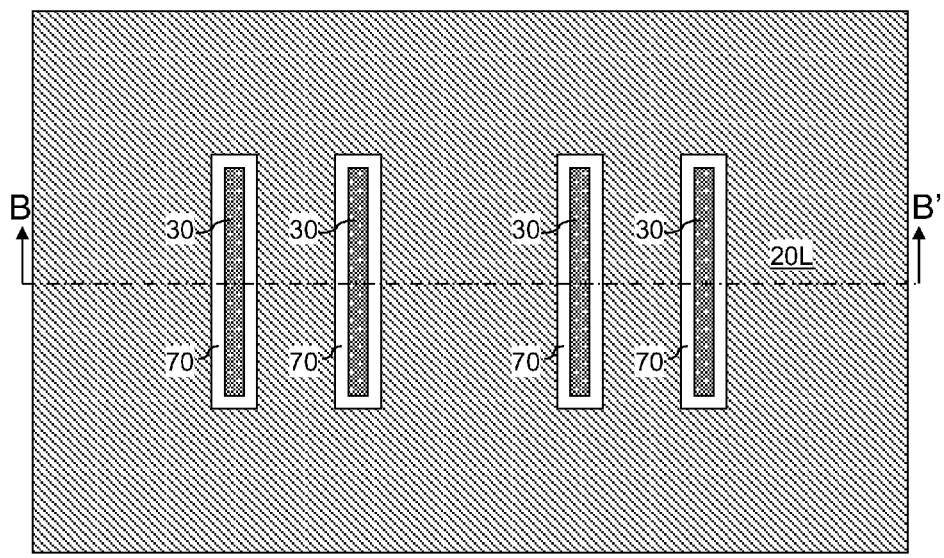
FIG. 10A is a top-down view of the first exemplary semiconductor structure after removal of the second hard mask portions according to an embodiment of the present disclosure.
Figure 10B:
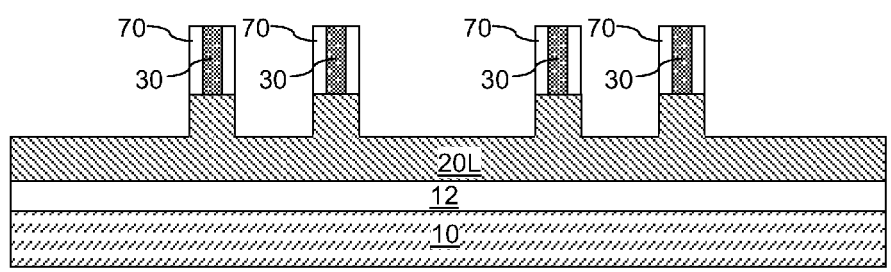
FIG. 10B is a vertical cross-sectional view of the first exemplary semiconductor structure along the vertical plane B-B' of FIG. 10A.

Referring to FIGS. 10A and 10B, the second hard mask portions 40 can be removed selective to the dielectric material portions 70 and the semiconductor material of the semiconductor material layer 20L by an etch. The etch can be an isotropic etch or an anisotropic etch. If the second hard mask portions 40 include a dielectric metal oxide, the removal of the second hard mask portions 40 can be performed by a wet etch that removes the dielectric metal oxide as known in the art.

Figure 11A:
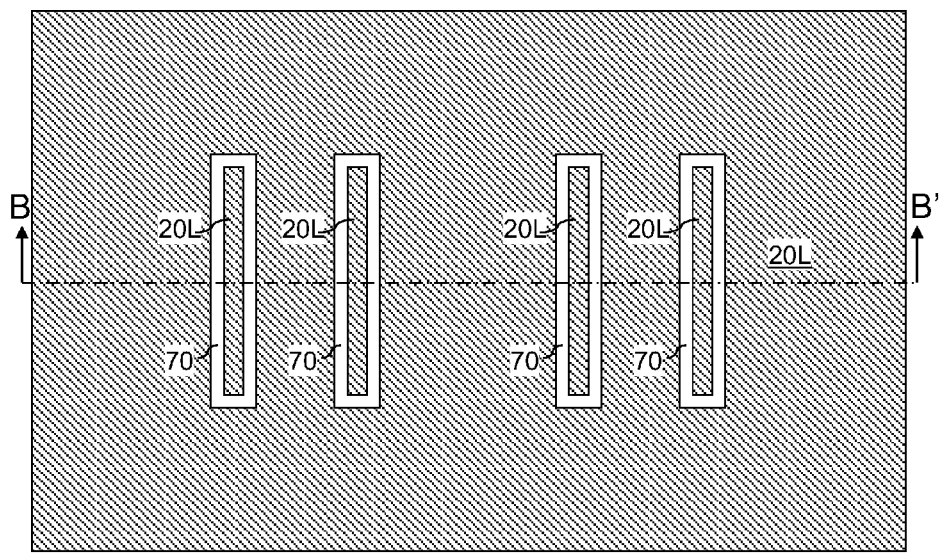
FIG. 11A is a top-down view of the first exemplary semiconductor structure after removal of first hard mask portions according to an embodiment of the present disclosure.
Figure 11B:
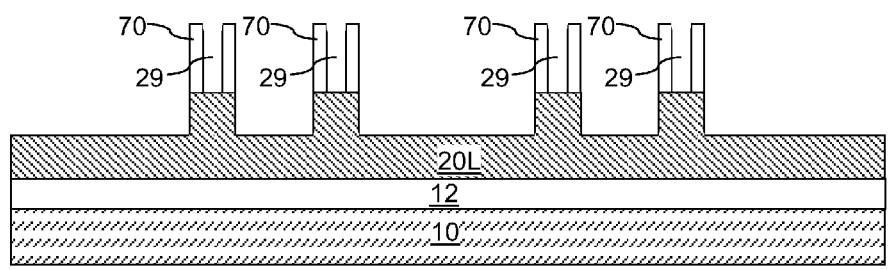
FIG. 11B is a vertical cross-sectional view of the first exemplary semiconductor structure along the vertical plane B-B' of FIG. 11A.

Referring to FIGS. 11A and 11B, the first hard mask portions 30 can be removed selective to the dielectric material portions 70 and the semiconductor material of the semiconductor material layer by another etch. The etch can be an isotropic etch or an anisotropic etch. If the first hard mask portions 30 include silicon nitride, the removal of the first hard mask portions 30 can be performed by a wet etch that employs hot phosphoric acid.

Figure 12A:
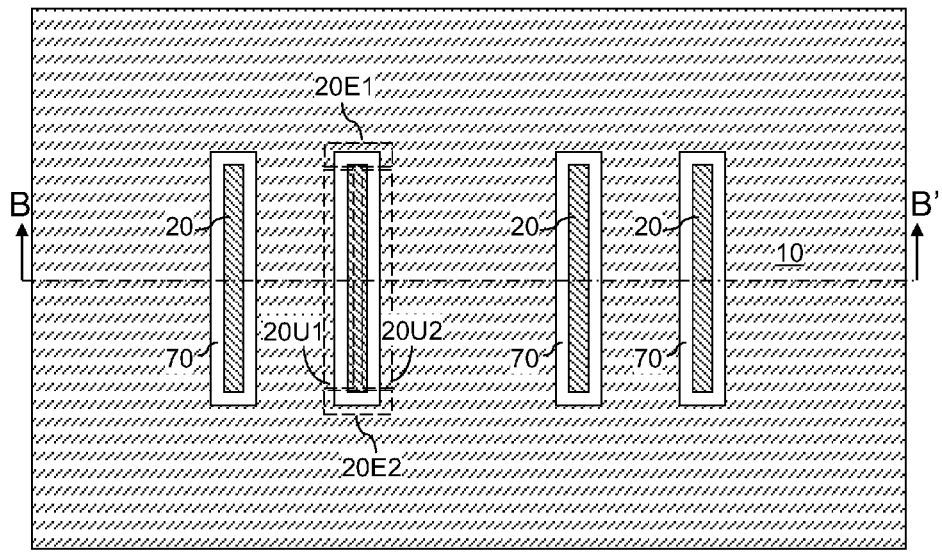
FIG. 12A is a top-down view of the first exemplary semiconductor structure after formation of semiconductor fins and cavities that are self-aligned to the semiconductor fins according to an embodiment of the present disclosure.
Figure 12B:
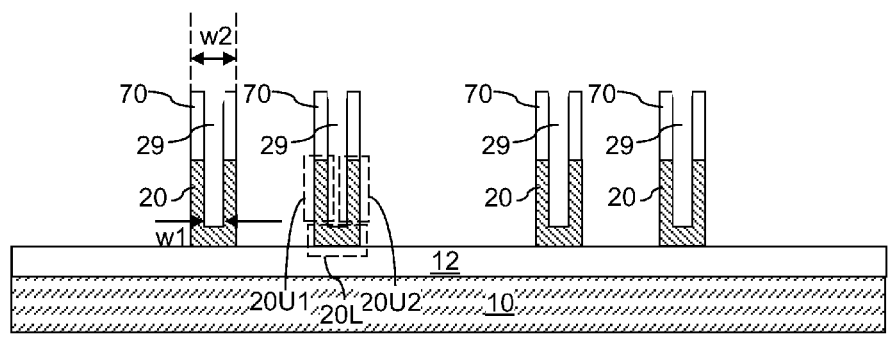
FIG. 12B is a vertical cross-sectional view of the first exemplary semiconductor structure along the vertical plane B-B' of FIG. 12A.

Referring to FIGS. 12A and 12B, the semiconductor material layer 20L is patterned into semiconductor fins 20 that are not contiguous with one another. The patterning of the semiconductor material layer 20L into the semiconductor fins 20 can be performed by anisotropically etching the semiconductor material layer 20L employing the dielectric material portions 70 as etch masks.

In one embodiment, the patterning of the semiconductor material layer 20L into the semiconductor fins 20 can be performed by simultaneously etching physically exposed portions of the semiconductor material layer 20L from a first area outside outer peripheries of the dielectric material portions 70 (i.e., the area located outside of the semiconductor pedestal portions 20P (See FIG. 9B)) and from second areas inside each inner periphery of the dielectric material portions 70. In one embodiment, the duration of the anisotropic etch can be selected such that the underlying layer located underneath the semiconductor material layer 20L, i.e., the buried insulator layer 12, can be physically exposed within the first area, and not physically exposed within the second areas. A trench having the first width w1 is formed within each semiconductor fin 20.

The semiconductor structure illustrated in FIGS. 12A and 12B includes semiconductor fins 20 located on a dielectric layer, which is the buried insulator layer 12. Each semiconductor fin 20 includes a lower portion 20L located underneath the bottom surface of a trench having the first width w1 and an upper portion located above the bottom surface of the trench. Within each semiconductor fin 20, the upper portion includes a first upper portion 20U1 integrally adjoined to a first peripheral portion of the lower portion 20L and a second upper portion 20U2 integrally adjoined to a second peripheral portion of the lower portion 20L. As used herein, a first element is "integrally adjoined to" a second element if the first element and the second element are contiguous without any discontinuity therebetween as a single integral structure. The cavity embedded in the semiconductor fin 20 vertically extends from top surfaces of the first upper portion 20U1 and the second upper portion 20U2 (which are the interfaces with the dielectric material portions 70) to a top surface of the lower portion 20L. The cavity laterally extends from an inner sidewall of the first upper portion to an inner sidewall of the second upper portion 20U2, and has the first width w1. Each cavity is self-aligned to the middle of the underlying semiconductor fin 20.

Within each semiconductor fin 20, the inner sidewall of the first upper portion 20U1 and the inner sidewall of the second upper portion 20U2 are a pair of parallel vertical sidewalls laterally spaced by the first width w1. An outer vertical sidewall of the first upper portion 20U1 and an outer vertical sidewall of the second upper portion 20U2 are another pair of vertical sidewalls laterally spaced by the second width w2. A lateral distance between the inner sidewall of the first upper portion 20U1 and the outer sidewall of the first upper portion 20U1 is (w2−w1)/2, and is the same as the lateral distance between the inner sidewall of the second upper portion 20U2 and the outer sidewall of the second upper portion 20U2. The outer vertical sidewall of the first upper portion 20U1 and the outer vertical sidewall of the second upper portion 20U2 extend from the top surfaces of the first upper portion 20U1 and the second upper portion 20U2 to a top surface of the buried insulator layer 12.

Within each semiconductor fin 20, the upper portion further includes a first upper end portion 20E1 and a second upper end portion 20E2 that are laterally adjoined to the first and second upper portions (20U1, 20U2). In one embodiment, sidewalls of the cavity can consist of the inner sidewall of the first upper portion 20U1, the inner sidewall of the second upper portion 20U2, and inner sidewalls of the first and second upper end portions (20E1, 20W2).

In one embodiment, each dielectric material portion 70 located on the underlying semiconductor fin 20 can have the same horizontal cross-sectional area as an upper portion of the underlying semiconductor fin 20. In one embodiment, a horizontal cross-sectional area of the upper portion of a semiconductor fin 20 can be a rectangular ring having a rectangular outer periphery and a rectangular inner periphery.

Optionally, the dielectric material portions 70 can be subsequently removed selective to the semiconductor fins 20 and the buried insulator layer 12, for example, by a wet etch.

Figure 13A:
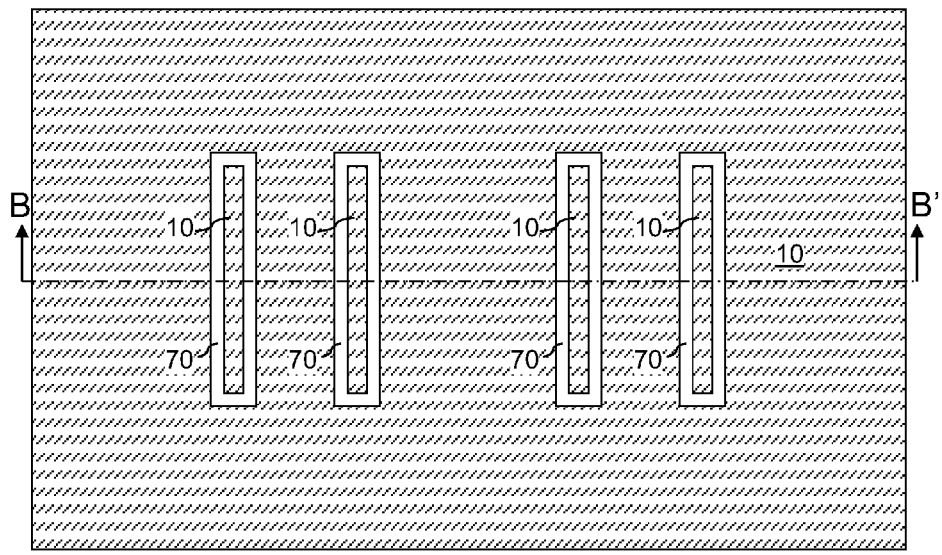
FIG. 13A is a top-down view of a variation of the first exemplary semiconductor structure after formation of semiconductor fins and cavities that are self-aligned to the semiconductor fins according to an embodiment of the present disclosure.
Figure 13B:
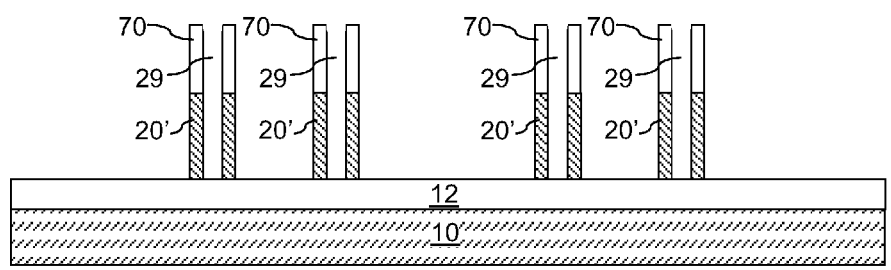
FIG. 13B is a vertical cross-sectional view of the first exemplary semiconductor structure along the vertical plane B-B' of FIG. 13A.

Referring to FIGS. 13A and 13B, a variation of the first exemplary semiconductor structure can be derived from the first exemplary semiconductor structure by extending the anisotropic etch that etches the semiconductor material of the semiconductor material layer 20L. The bottom surface of each cavity is recesses until the bottom surfaces of the cavities coincide with top surfaces of the buried insulator layer. In this case, a ring shaped semiconductor fin having a same width, which is (w2−w1)/2, throughout and including vertical sidewalls extending from bottommost portions of the sidewalls of the dielectric material portions 70 to the top surface of the buried insulator layer are formed. Each cavity is self aligned to the center of a ring-shaped semiconductor fin.

Figure 14A:
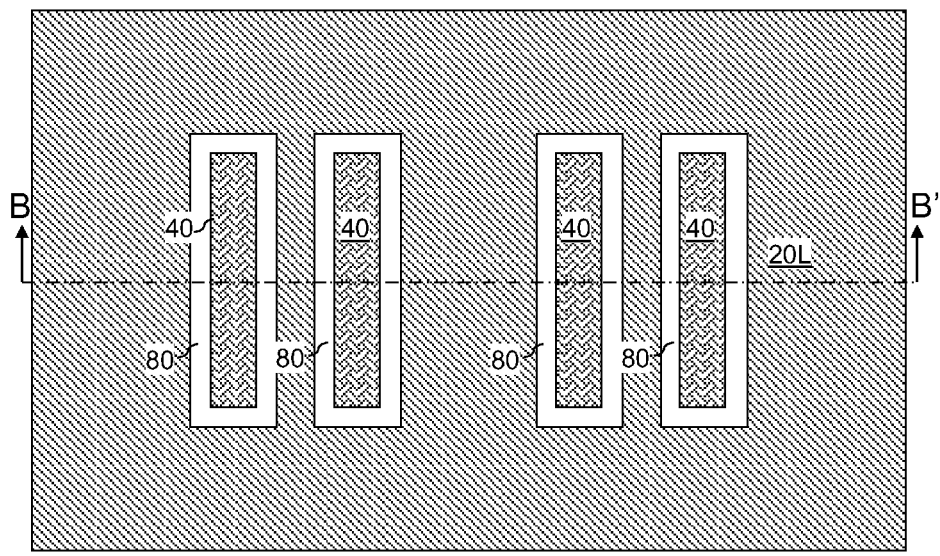
FIG. 14A is a top-down view of a second exemplary semiconductor structure after formation of disposable spacers according to an embodiment of the present disclosure.
Figure 14B:
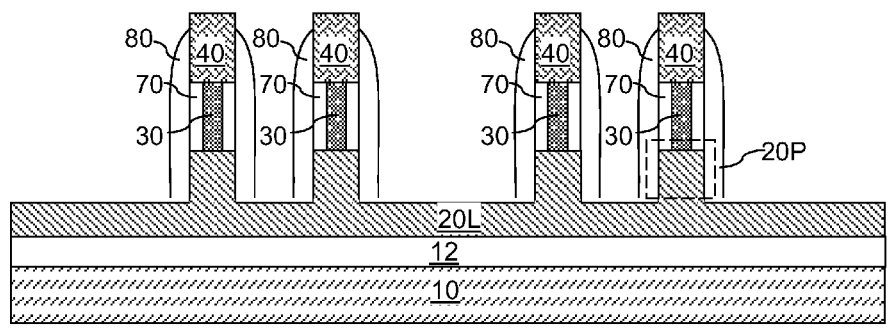
FIG. 14B is a vertical cross-sectional view of the second exemplary semiconductor structure along the vertical plane B-B' of FIG. 14A.

Referring to FIGS. 14A and 14B, a second exemplary semiconductor structure according to a second embodiment of the present disclosure is derived from the first exemplary semiconductor structure of FIGS. 9A and 9B by depositing disposable spacers 80 on the sidewalls of each vertical stack of a composite structure of a first hard mask portion 30 and a dielectric material portion 70 and a second hard mask portion 40. The disposable spacers 80 can be any material that is different from the semiconductor material of the semiconductor material layer 20L provided that an etch chemistry exists for etching the semiconductor material of the semiconductor material layer 20L selective to the material of the disposable spacers 80. For example, the disposable spacers 80 can include silicon nitride, silicon oxide, organosilicate glass, a dielectric metal oxide, or combinations thereof.

The disposable spacers 80 can be formed by conformally depositing a material layer and anisotropically etching horizontal portions of the material layer. The disposable spacers 80 are formed on sidewalls of the semiconductor pedestal portions 20P.

Figure 15A:
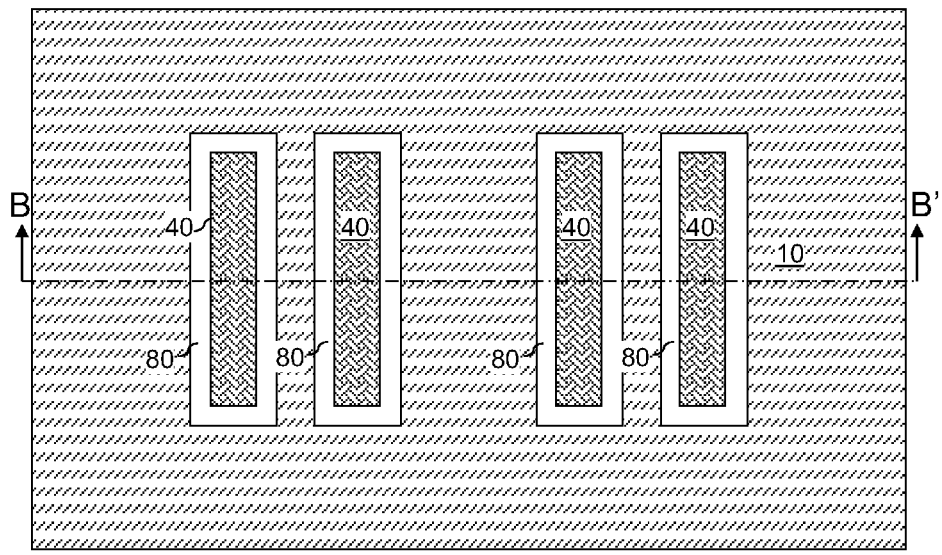
FIG. 15A is a top-down view of the first second exemplary semiconductor structure after forming semiconductor fins having undercuts according to an embodiment of the present disclosure.
Figure 15B:
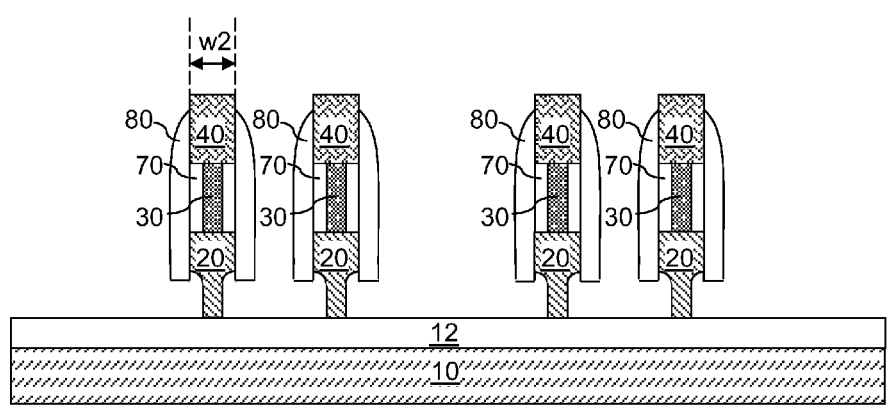
FIG. 15B is a vertical cross-sectional view of the second exemplary semiconductor structure along the vertical plane B-B' of FIG. 15A.

Referring to FIGS. 15A and 15B, the semiconductor material of the semiconductor material layer 20L are isotropically etched, for example, employing a wet etch. The chemistry of the wet etch can be selected to remove the semiconductor material of the semiconductor material layer 20L selective to the material of the disposable spacers 80. For example, if the semiconductor material is silicon, a wet etch employing KOH can be employed. Portions of the semiconductor material layer 20L are removed from underneath the disposable spacer 20. The chemistry and the duration of the isotropic etch can be selected such that remaining portions of the semiconductor material layer 20L are not separated from the buried insulator layer 12. The remaining portions of the semiconductor material layer 20L constitute semiconductor fins 20, which has a lower potion having a lesser width than an upper portion, which has the second width w2.

The underlying layer located underneath the semiconductor material layer 20L, i.e., the buried insulator layer 12, is physically exposed within the first area located outside the sidewalls of the vertical stacks (30, 70, 40), while the underlying layer is not physically exposed within the second areas that underlie the first hard mask portions 30.

Figure 16A:
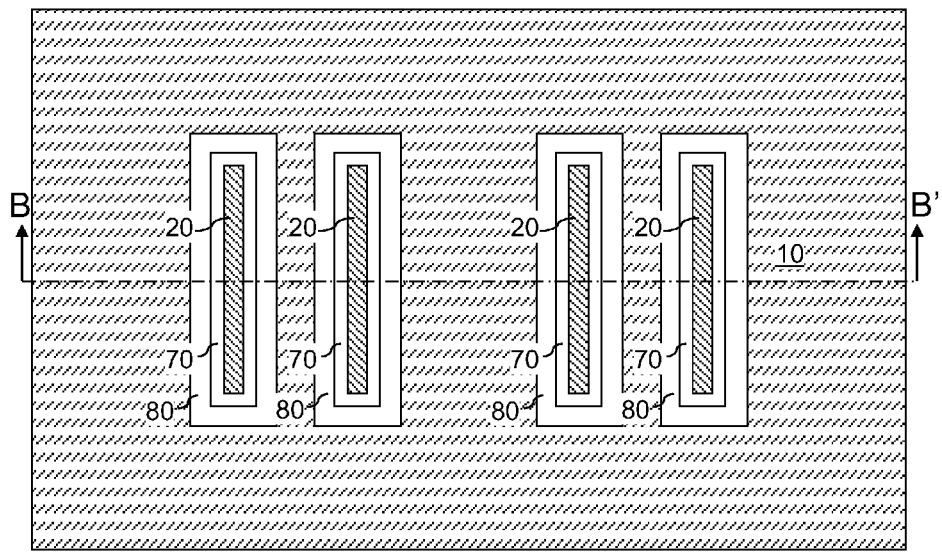
FIG. 16A is a top-down view of the second exemplary semiconductor structure after removal of first and second hard mask portions according to an embodiment of the present disclosure.
Figure 16B:
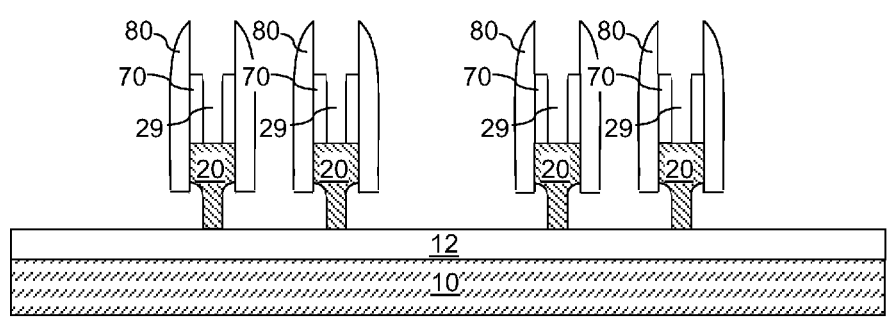
FIG. 16B is a vertical cross-sectional view of the second exemplary semiconductor structure along the vertical plane B-B' of FIG. 16A.

Referring to FIGS. 16A and 16B, the second hard mask portions 40 and the first hard mask portions 30 are removed from above the semiconductor fins 20. The processing steps of FIGS. 10A, 10B, 11A, and 11B can be employed to remove the second hard mask portions 40 and the first hard mask portions 30. The disposable spacers 80 may, or many not, be removed during removal of the second hard mask portions 40 and/or during removal of the first hard mask portions 30.

Figure 17A:
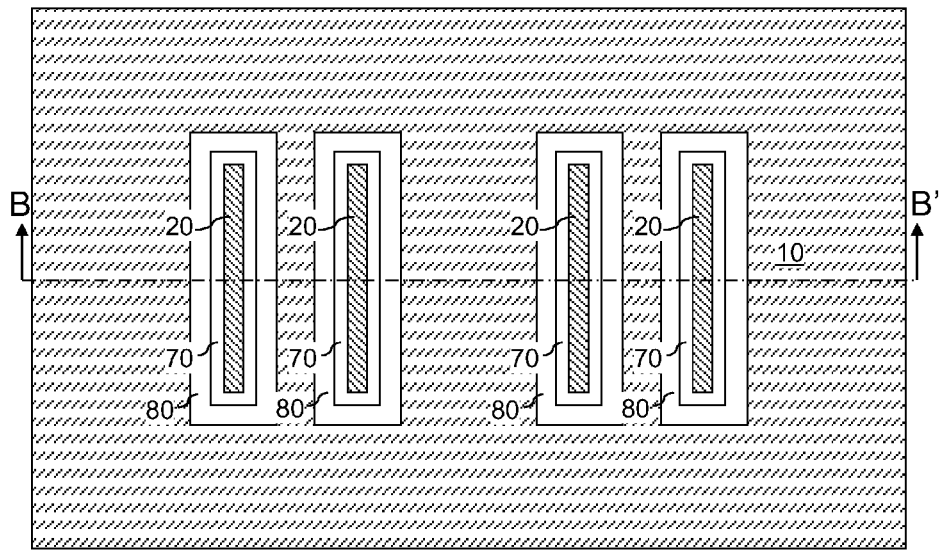
FIG. 17A is a top-down view of the second exemplary semiconductor structure after formation of cavities that are self-aligned to the semiconductor fins according to an embodiment of the present disclosure.
Figure 17B:
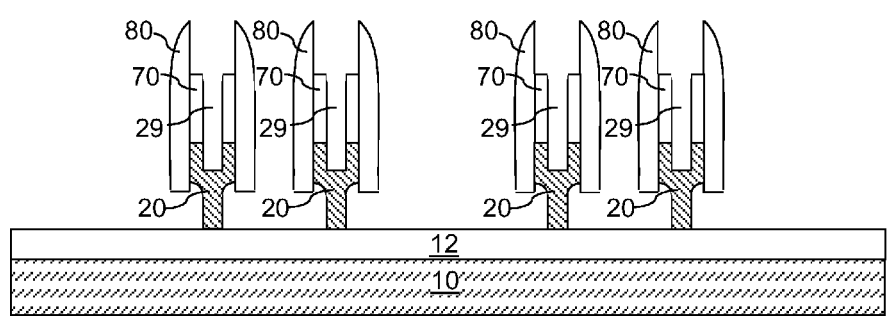
FIG. 17B is a vertical cross-sectional view of the second exemplary semiconductor structure along the vertical plane B-B' of FIG. 17A.

Referring to FIGS. 17A and 17B, physically exposed top surfaces of the semiconductor fins 20 underneath each cavity laterally surrounded by inner sidewalls of the dielectric material portions 70 are vertically recessed by an anisotropic etch. The anisotropic etch employs the dielectric material portions 70 as etch masks. In one embodiment, the duration of the anisotropic etch can be selected such that the recessed surfaces of the semiconductor fins 20 do not reach the outer surfaces of the semiconductor fins 20 that extend between the buried insulator layer 12 and the vertical outer sidewalls of the semiconductor fins 20 laterally separated by the second width w2. Thus, each semiconductor fin 20 remains a single integral structure after the anisotropic etch that recesses the physically exposed top surface of the semiconductor fin 20. A trench having the first width w1 is formed within each semiconductor fin 20. Each cavity is self-aligned to a semiconductor fin 20.

In one embodiment, each dielectric material portion 70 located on the underlying semiconductor fin 20 can have the same horizontal cross-sectional area as an upper portion of the underlying semiconductor fin 20. In one embodiment, a horizontal cross-sectional area of the upper portion of a semiconductor fin 20 can be a rectangular ring having a rectangular outer periphery and a rectangular inner periphery.

Figure 18A:
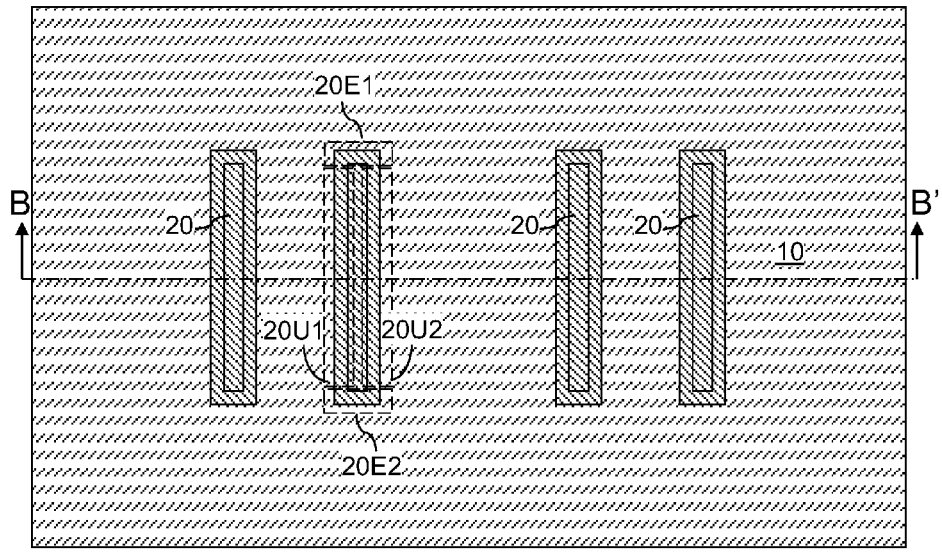
FIG. 18A is a top-down view of the second exemplary semiconductor structure after removal of the disposable spacers and dielectric material portions according to an embodiment of the present disclosure.
Figure 18B:
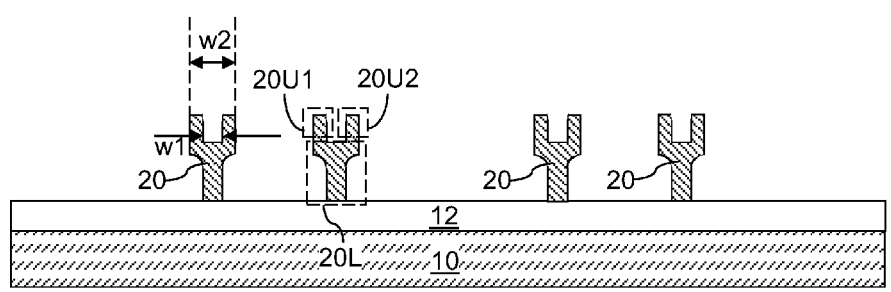
FIG. 18B is a vertical cross-sectional view of the second exemplary semiconductor structure along the vertical plane B-B' of FIG. 18A.

Referring to FIGS. 18A and 18B, the dielectric material portions 70 can be subsequently removed selective to the semiconductor fins 20 and the buried insulator layer 12, for example, by a wet etch. The disposable spacers 80 can also be removed selective to the semiconductor fins 20 and the buried insulator layer, for example, by a wet etch if the disposable spacers 80 have not been previously removed.

The semiconductor structure illustrated in FIGS. 18A and 18B includes semiconductor fins 20 located on a dielectric layer, which is the buried insulator layer 12. Each semiconductor fin 20 includes a lower portion 20L located underneath the bottom surface of a trench having the first width w1 and an upper portion located above the bottom surface of the trench. Within each semiconductor fin 20, the upper portion includes a first upper portion 20U1 integrally adjoined to a first peripheral portion of the lower portion 20L and a second upper portion 20U2 integrally adjoined to a second peripheral portion of the lower portion 20L. The cavity embedded in the semiconductor fin 20 vertically extends from top surfaces of the first upper portion 20U1 and the second upper portion 20U2 (which are the interfaces with the dielectric material portions 70) to a top surface of the lower portion 20L. The cavity laterally extends from an inner sidewall of the first upper portion to an inner sidewall of the second upper portion 20U2, and has the first width w1. Each cavity is self-aligned to the middle of the underlying semiconductor fin 20.

Within each semiconductor fin 20, the inner sidewall of the first upper portion 20U1 and the inner sidewall of the second upper portion 20U2 are a pair of parallel vertical sidewalls laterally spaced by the first width w1. An outer vertical sidewall of the first upper portion 20U1 and an outer vertical sidewall of the second upper portion 20U2 are another pair of vertical sidewalls laterally spaced by the second width w2. A lateral distance between the inner sidewall of the first upper portion 20U1 and the outer sidewall of the first upper portion 20U1 is (w2−w1)/2, and is the same as the lateral distance between the inner sidewall of the second upper portion 20U2 and the outer sidewall of the second upper portion 20U2. The outer vertical sidewall of the first upper portion 20U1 and the outer vertical sidewall of the second upper portion 20U2 extend from the top surfaces of the first upper portion 20U1 and the second upper portion 20U2 to a top surface of the buried insulator layer 12.

Within each semiconductor fin 20, the upper portion further includes a first upper end portion 20E1 and a second upper end portion 20E2 that are laterally adjoined to the first and second upper portions (20U1, 20U2). In one embodiment, sidewalls of the cavity can consist of the inner sidewall of the first upper portion 20U1, the inner sidewall of the second upper portion 20U2, and inner sidewalls of the first and second upper end portions (20E1, 20W2).

Within each semiconductor fin 20, the lower portion 20L includes a pair of curved sidewalls that adjoin bottom portions of the outer vertical sidewall of the first upper portion 20U1 and the outer vertical sidewall of the second upper portion 20U2. The pair of curved sidewalls can have a vertically varying lateral distance therebetween. In one embodiment, the vertically varying lateral distance is not greater than the second width w2.

The methods of the present disclosure can be employed to provide semiconductor fins having an increased surface area due to the presence of a trench therein. The width of the trench can be a sublithographic dimension. The increase in the surface area of the semiconductor fins of the present disclosure relative to semiconductor fins known in the art can be advantageously employed to form semiconductor devices of which the performance can be enhanced by increase in the surface area. For example, the semiconductor fins of the present disclosure can be advantageously employed to form a field effect transistor so that a center portion of the semiconductor fin can be employing as a channel region providing a greater channel width compared with channels of conventional semiconductor fins.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A semiconductor structure comprising a semiconductor fin having a bottommost surface that contacts a top surface of a dielectric layer, said semiconductor fin comprising a lower portion and an upper portion, said upper portion comprising a first upper portion integrally adjoined to a first peripheral portion of said lower portion and a second upper portion integrally adjoined to a second peripheral portion of said lower portion, wherein a cavity embedded in said semiconductor fin vertically extends from top surfaces of said first and second upper portions to a top surface of said lower portion, and laterally extends from an inner sidewall of said first upper portion to an inner sidewall of said second upper portion.

2. The semiconductor structure of claim 1, wherein said inner sidewall of said first upper portion and said inner sidewall of said second upper portion are a pair of parallel vertical sidewalls laterally spaced by a first width.

3. The semiconductor structure of claim 2, wherein an outer vertical sidewall of said first upper portion and an outer vertical sidewall of said second upper portion are another pair of vertical sidewalls laterally spaced by a second width.

4. The semiconductor structure of claim 3, wherein a lateral distance between said inner sidewall of said first upper portion and said outer sidewall of said first upper portion is the same as a lateral distance between said inner sidewall of said second upper portion and said outer sidewall of said second upper portion.

5. The semiconductor structure of claim 3, wherein said outer vertical sidewall of said first upper portion and said outer vertical sidewall of said second upper portion extend from said top surfaces of said first and second upper portions to a top surface of said dielectric layer.

6. The semiconductor structure of claim 3, wherein said lower portion comprises a pair of curved sidewalls that adjoin bottom portions of said outer vertical sidewall of said first upper portion and said outer vertical sidewall of said second upper portion.

7. The semiconductor structure of claim 6, wherein said pair of curved sidewalls have a vertically varying lateral distance therebetween.

8. The semiconductor structure of claim 7, wherein said vertically varying lateral distance is not greater than said second width.

9. The semiconductor structure of claim 1, wherein said upper portion further comprises a first upper end portion and a second upper end portion that are laterally adjoined to said first and second upper portions, wherein sidewalls of said cavity consist of said inner sidewall of said first upper portion, said inner sidewall of said second upper portion, and inner sidewalls of said first and second upper end portions.

10. The semiconductor structure of claim 1, further comprising a dielectric material portion located on said semiconductor fin and having a same horizontal cross-sectional area as an upper portion of said semiconductor fin.

11. The semiconductor structure of claim 1, wherein a horizontal cross-sectional area of said semiconductor fin is a rectangular ring having a rectangular outer periphery and a rectangular inner periphery.

12. A semiconductor structure comprising a semiconductor fin located on a dielectric layer, said semiconductor fin comprising a lower portion and an upper portion, said upper portion comprising a first upper portion integrally adjoined to a first peripheral portion of said lower portion and a second upper portion integrally adjoined to a second peripheral portion of said lower portion, wherein a cavity embedded in said semiconductor fin vertically extends from top surfaces of said first and second upper portions to a top surface of said lower portion, and laterally extends from an inner sidewall of said first upper portion to an inner sidewall of said second upper portion, and wherein said lower portion comprises a pair of curved sidewalls that adjoin bottom portions of an outer vertical sidewall of said first upper portion and an outer vertical sidewall of said second upper portion.

13. The semiconductor structure of claim 12, wherein said inner sidewall of said first upper portion and said inner sidewall of said second upper portion are a pair of parallel vertical sidewalls laterally spaced by a first width.

14. The semiconductor structure of claim 13, wherein an outer vertical sidewall of said first upper portion and an outer vertical sidewall of said second upper portion are another pair of vertical sidewalls laterally spaced by a second width.

15. The semiconductor structure of claim 14, wherein a lateral distance between said inner sidewall of said first upper portion and said outer sidewall of said first upper portion is the same as a lateral distance between said inner sidewall of said second upper portion and said outer sidewall of said second upper portion.

16. The semiconductor structure of claim 14, wherein said outer vertical sidewall of said first upper portion and said outer vertical sidewall of said second upper portion extend from said top surfaces of said first and second upper portions to a top surface of said dielectric layer.

17. The semiconductor structure of claim 12, wherein said pair of curved sidewalls have a vertically varying lateral distance therebetween.

18. The semiconductor structure of claim 17, wherein said vertically varying lateral distance is not greater than said second width.

19. The semiconductor structure of claim 12, wherein said upper portion further comprises a first upper end portion and a second upper end portion that are laterally adjoined to said first and second upper portions, wherein sidewalls of said cavity consist of said inner sidewall of said first upper portion, said inner sidewall of said second upper portion, and inner sidewalls of said first and second upper end portions.

20. The semiconductor structure of claim 12, further comprising a dielectric material portion located on said semiconductor fin and having a same horizontal cross-sectional area as an upper portion of said semiconductor fin.

* * * * *